United States Patent
Matoy et al.

(10) Patent No.: US 8,502,274 B1
(45) Date of Patent: Aug. 6, 2013

(54) INTEGRATED CIRCUIT INCLUDING POWER TRANSISTOR CELLS AND A CONNECTING LINE

(75) Inventors: Kurt Matoy, Strau (AT); Thomas Detzel, Villach (AT); Michael Nelhiebel, Villach (AT); Arno Zechmann, Villach (AT); Stefan Decker, Munich (DE); Robert Illing, Villach (AT); Sven Gustav Lanzerstorfer, Feldkirchen (AT); Christian Djelassi, Villach (AT); Bernhard Auer, Millstatt (AT); Stefan Woehlert, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/441,380

(22) Filed: Apr. 6, 2012

(51) Int. Cl.
*H01L 23/52* (2006.01)
(52) U.S. Cl.
USPC .......................................... 257/208; 257/210
(58) Field of Classification Search
USPC ................. 257/208, 210, 203, 206, 691, 773
See application file for complete search history.

(56) References Cited

U.S. PATENT DOCUMENTS

| | | | |
|---|---|---|---|
| 7,046,543 B2* | 5/2006 | Arimoto et al. | 365/149 |
| 2002/0158299 A1* | 10/2002 | Castro Simas et al. | 257/499 |
| 2005/0018471 A1* | 1/2005 | Arimoto et al. | 365/149 |
| 2005/0258464 A1* | 11/2005 | Zundel et al. | 257/296 |
| 2009/0065874 A1* | 3/2009 | Ishii | 257/393 |
| 2010/0097875 A1* | 4/2010 | Vinke et al. | 365/226 |
| 2012/0299065 A1* | 11/2012 | Shimizu | 257/211 |

OTHER PUBLICATIONS

Djelassi, C.: "Investigation on Degradation of Aluminum Lines Caused by Fast and Defined Temperature Cycling", Master Thesis, Alps-Adriatic University of Klagenfurt, Jun. 2011.
Smorodin, T. et al.: "Investigation and Improvement of Fast Temperature-Cycle Reliability for DMOS-Related Conductor Path Design"; IEEE International Reliability Physics Symposium 2007, pp. 486-491, 2007.
Smorodin, T. et al.: "A Temperature-Gradient-Induced Failure Mechanism in Metallization Under Fast Thermal Cycling"; IEEE Trans Dev Mater Reliab vol. 8 (3), pp. 590-599, 2008.
Suc, Z. "Reliability of Interconnect Structures." Comprehensive Structural Integrity, vol. 8: Interfacial and Nanoscale Failure, Elsevier, Amsterdam, pp. 265-324, 2003.

* cited by examiner

*Primary Examiner* — S. V. Clark
(74) *Attorney, Agent, or Firm* — Murphy, Bilak & Homiller, PLLC

(57) ABSTRACT

Power transistor cells are formed in a cell array of an integrated circuit. Contact vias may electrically connect a metal structure above the cell array and the power transistor cells. A connecting line electrically connects a first element arranged in the cell array and a second element arranged in a peripheral region. A portion of the connecting line is arranged between the metal structure and the cell array and runs between a first axis and a second axis which are arranged parallel and at a distance to each other. The distance is greater than a width of the connecting line portion. The connecting line portion is tangent to both the first axis and the second axis. Shear-induced material transport along the connecting line is reduced by shortening critical portions or by exploiting grain boundary effects. The reliability of an insulator structure covering the connecting line is increased.

25 Claims, 9 Drawing Sheets

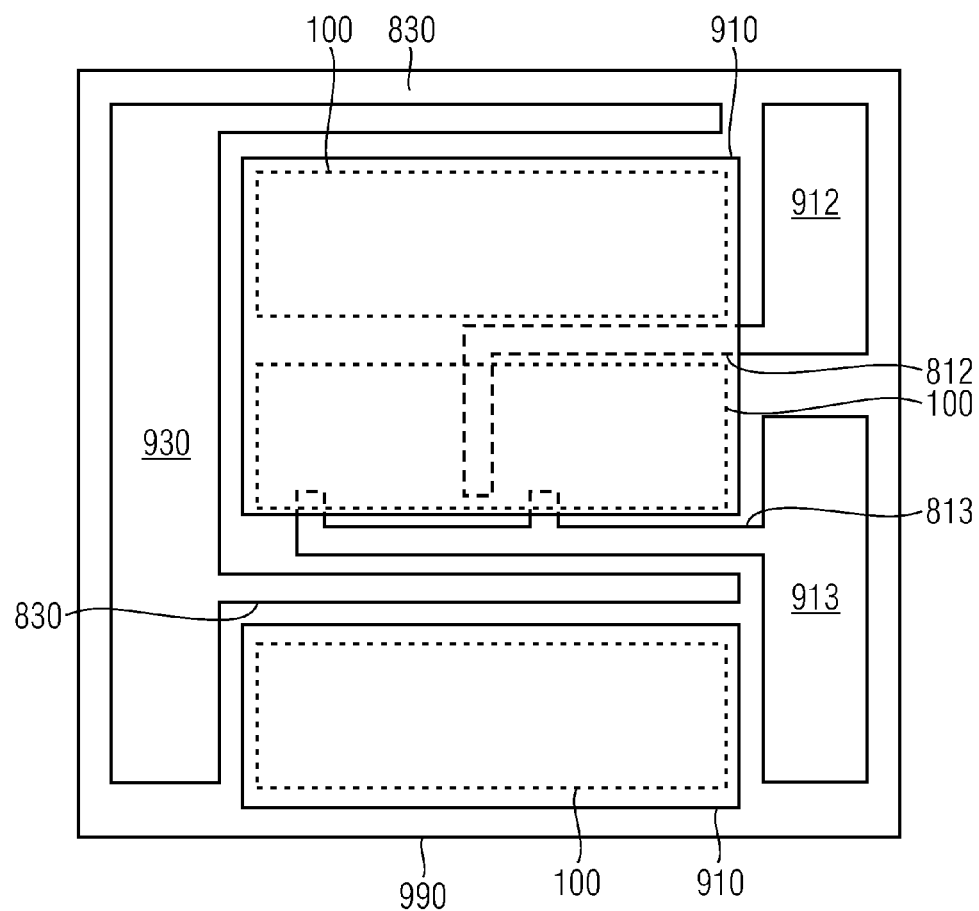

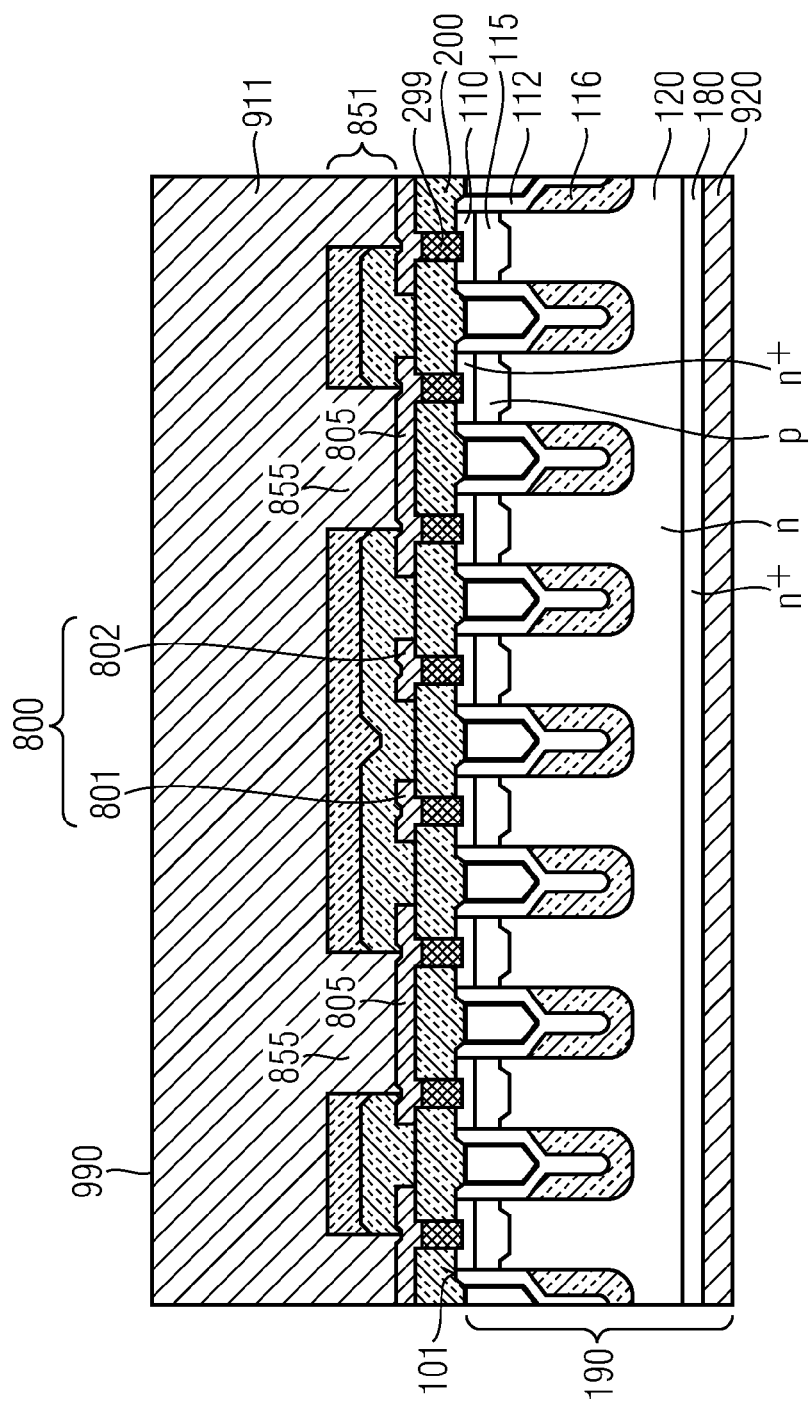

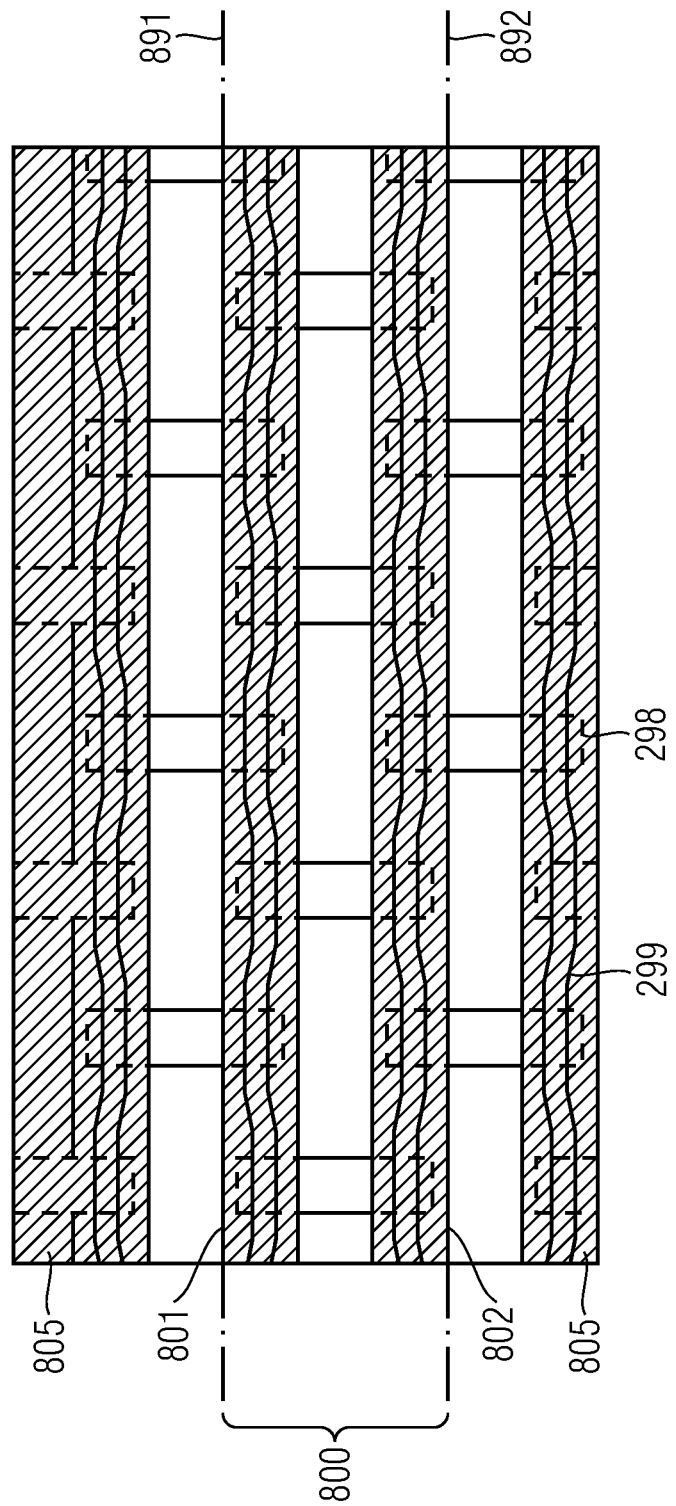

INTEGRATED CIRCUIT INCLUDING POWER TRANSISTOR CELLS AND A CONNECTING LINE

BACKGROUND

Integrated circuits for power applications include power transistor cells controlling a load current in a load path between the drain and source terminals of the integrated circuit. The power transistor cells are formed in cell arrays. In addition to power transistor cells supplying the load current, the cell arrays may include sense elements for sensing a temperature in the cell array or for measuring the load current in the load path. Connecting lines connect gate electrodes of the power transistor cells and sense elements formed in the cell arrays with terminals or signal interfaces arranged outside the cell arrays.

It is desirable to improve the reliability of connecting lines extending within the cell arrays or between the cell arrays and terminals or signal interfaces outside the cell arrays.

SUMMARY

According to an embodiment an integrated circuit includes power transistor cells which are formed in a cell array. A metal structure is formed above the cell array. A connecting line electrically connects a first element arranged in the cell array and a second element arranged outside the cell array. A portion of the connecting line is arranged between the metal structure and the cell array and runs between a first axis and a second axis which are arranged in parallel and in a distance to each other. The distance between the first and the second axis is greater than a width of the connecting line portion. The connecting line portion is tangent to both the first axis and the second axis.

According to another embodiment, an integrated circuit includes power transistor cells that are formed in a cell array. A metal structure is formed above the cell array. A connecting line electrically connects a first element arranged in the cell array and a second element arranged in the cell array. The connecting line is arranged between the metal structure and the cell array and runs between a first axis and a second axis arranged in parallel and at a distance to each other, wherein the distance is greater than a width of the connecting line portion and the connecting line portion is tangent to both the first axis and the second axis.

Those skilled in the art will recognize additional features and advantages upon reading the following detailed description and upon viewing the accompanying drawings.

BRIEF DESCRIPTION OF THE DRAWINGS

The accompanying drawings are included to provide a further understanding of embodiments of the invention and are incorporated in and constitute a part of the specification. The drawings illustrate the embodiments of the present invention and together with the description serve to explain the principles of the invention. Other embodiments of the invention and many of the intended advantages will be readily appreciated as they become better understood by reference to the following detailed description. The elements of the drawings are not necessarily to scale relative to each other. Like reference numerals designate corresponding similar parts. The features of the various illustrated embodiments can be combined unless they exclude each other.

FIG. 3 is a schematic plan view of a semiconductor die of an integrated circuit with various connecting lines according to a further embodiment.

FIG. 6A is a schematic cross-sectional view of an integrated circuit including sense lines according to a further embodiment.

FIG. 7B is a schematic layout of a portion of an integrated circuit including a split sense line.

DETAILED DESCRIPTION

In the following detailed description, reference is made to the accompanying drawings, which form a part hereof, and in which are shown by way of illustrations specific embodiments in which the invention may be practiced. In this regard, directional terminology, such as "above", "below" is used with reference to the orientation of the Figures being described. Because components of the embodiments can be positioned in a number of different orientations, the directional terminology is used for purposes of illustration and is in no way limiting.

It is to be understood that other embodiments may be utilized in structural or logical changes may be made without departing from the scope of the present invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements have be designated by the same references in the different drawings if not stated otherwise.

The term "electrically connected" describes a low-ohmic electric connection between the elements electrically connected together, e.g., a connection via a metal and/or highly doped semiconductor or other low-ohmic intervening elements such as vias, contact structures, and metal lines by way of example.

Terms such as "first", "second", and the like are used to describe various elements, regions, sections, etc. and are not intended to be limiting. The terms "having", "containing", "including", "comprising" are open-ended terms that indicate the presence of stated elements or features but do not preclude the presence of additional elements or features. The articles "a", "an" and "the" include the plural as well as the singular, unless the context clearly indicates otherwise.

Figure 1:
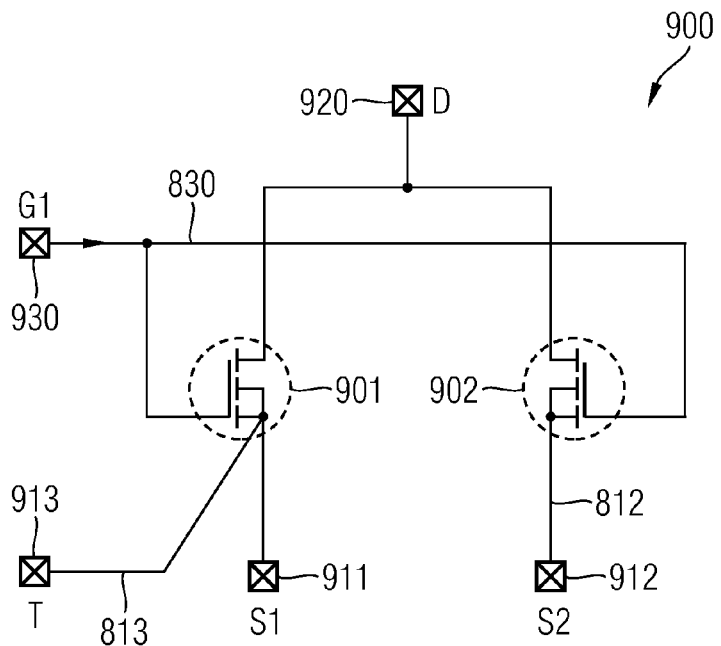
FIG. 1 is a simplified circuit diagram of an integrated circuit with power transistor cells and a current sense element according to embodiments providing a tapping pad.

FIG. 1 shows a circuit diagram of an integrated circuit 900 including transistor cells. Power transistor cells formed in one or more cell arrays form a power transistor 901. One or more of the transistor cells in the cell arrays may be defined as sense transistor cell(s) of a sense transistor 902. The power and sense transistors 901, 902 may be bipolar transistors, JFETs (junction field effect transistors), IGFETs (insulated gate field effect transistors), for example MOSFETs (metal oxide semiconductor field effect transistors) in the usual meaning in the art, where the gate electrode is not necessarily provided from a metal, IGBTs (insulated gate bipolar transistors), or high electron mobility transistors.

The gate electrodes of the power and sense transistors 901, 902 may be connected with each other and with a gate terminal 930. Drain regions of both the power transistor 901 and the sense transistor 902 may be connected to a drain terminal 920. Source regions of the power transistor 901 are connected to a source terminal 911, whereas the source region of the sense transistor 902 may be connected to a sense source terminal 912. A potential applied via gate terminal 930 to the gate electrode of the power transistor 901 controls a load current between the drain terminal 920 and the source terminal 911 through the power transistor 901. The sense transistor 902 is controlled analogously and operated under defined load conditions. A potential difference between a first potential at the source regions of the sense transistor 902 and a second potential at the source regions of the power transistor cells can be used to estimate the load current supplied via the source terminal 911. A tapping line 813 may directly electrically connect a tapping terminal 913 with selected ones of the source regions of the power transistor cells, such that the measurement of the source potential of the power transistor 901 does not depend from a load current flowing along a connection structure between the source regions of the power transistor cells and the source terminal 911.

A gate line 830 electrically connects the gate terminal 930 and the gate electrodes in the cell array. The tapping line 813 connects the source regions of the power transistor 901 and the tapping terminal 913. A sense line 812 connects the source region of the sense transistor cell or another element, for example a temperature sense element and the sense terminal 912. At least one of the gate line 830, tapping line 813 or sense line 812 connects a first element arranged in the cell array and a second element, wherein the first element may be a power transistor cell, a sense transistor cell or a further sense element. According to an embodiment, the second element is arranged outside the cell array, wherein the second element may be a terminal, a pad, or a logic portion of the integrated circuit. According to another embodiment, the second element is arranged inside the cell array and may be a further sense element or a power transistor cell, by way of example. The gate line 830, the tapping line 813 and/or the sense line 812 may define a connecting line used to tap or apply potentials rather than to transport current such that only low currents flow along the respective lines.

According to an embodiment, one, two or all of the sense line 812, the tapping line 813 or the gate line 830 include a portion that runs between a first axis and a second axis which are arranged in parallel and at a distance to each other, wherein the distance is greater than a width of the connecting line portion in a direction perpendicular to the first and the second axes. The connecting line portion is tangent to both the first axis and the second axis. The first and second axes span a target corridor for the connecting line, wherein the connecting line runs within the corridor without filling the corridor completely.

Figure 2:
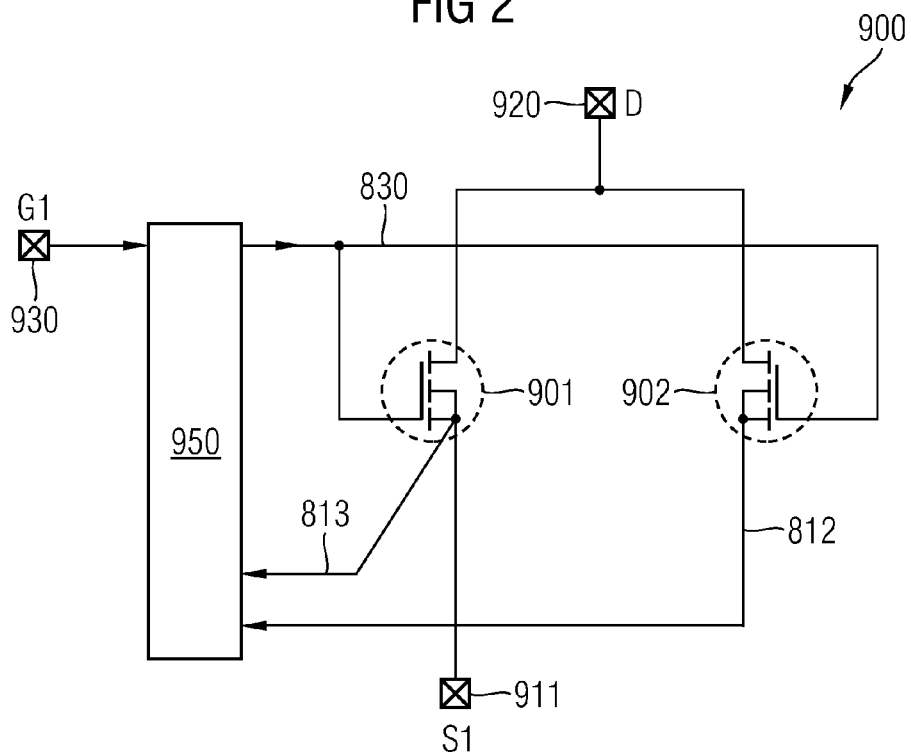
FIG. 2 is a simplified circuit diagram of an integrated circuit including power transistor cells and a current sense element according to an embodiment providing a sense current evaluation unit.

According to the embodiment of FIG. 2 the integrated circuit comprises a sense current evaluation unit 950 arranged outside the cell array 100. According to an embodiment the sense current evaluation unit 950 may be provided in a region directly adjoining the cell array 100. According to other embodiments the sense current evaluation unit 950 may be provided in a peripheral region of the integrated circuit which is closer to the edge than to a center of a semiconductor die of the integrated circuit. The tapping line 813 electrically connects selected source regions of the power transistor 901 with the sense current evaluation unit 950 and extends between the cell array and the peripheral region. The sense line 812 electrically connects the source region of the sense transistor cells or another sense element with the sense current evaluation unit 950 and extends between the cell array and the peripheral region. The gate line 830 may connect the gate conductor structures of the power and sense transistors 901, 902 with the sense current evaluation unit 950 and extends between the cell array and the peripheral region.

FIG. 3 shows a schematic plan view on a semiconductor die 990 of an integrated circuit according to an embodiment. A multitude of different layouts exists and FIG. 3 serves only for illustrating examples of connecting lines. The semiconductor die 990 provides several cell arrays 100. The cell arrays 100 may be rectangular or may have an L-shape, by way of example. A gate line 830 (gate finger) extends along at least one edge of each cell array 100. The gate lines 830 may be connected to a gate terminal 930. Each cell array 100 is connected to a metal structure providing a source electrode 910 above the cell arrays 100. The metal structure may have a thickness of at least 1 micrometer and may be connected with transistor cells forming the cell array 100. Contact structures may extend between the source electrode 910 and the cell array 100 or metallization lines connected to the cell array 100. A tapping line 813 may contact the source regions of one or some of the power transistor cells of the cell arrays 100 with a tapping terminal 913. A sense line 812 may connect the source region of a sense transistor cell 902 or another sense element in at least one of the cell arrays 100 with a sense terminal 912. The semiconductor die 990 may also include elements for temperature sensing, for example selected transistor cells or sense resistors.

Typically, the sense transistor cells and at least some of the power transistor cells selected for tapping are arranged within the cell arrays 100, where during operation the highest temperatures occur. On the other hand, the terminals 912, 913, 930 or the current sense evaluation circuit 950 of FIG. 2 are typically arranged outside the cell arrays 100. Further, the arrangement of the cell arrays 100 results in that the gate lines 830, the sense line 812 and the tapping line 813 have relatively long straight portions without bends and junctions and without contact vias to other conductive structures.

Heat generated by the load current in the cell arrays 100 in combination with the thick, rigid metal structure above the cell arrays 100 can result in significant mechanical failure in such types of connecting lines that are arranged between the metal structure and the cell arrays 100 and that are not connected to the metal structure through contact vias.

Figure 4A:
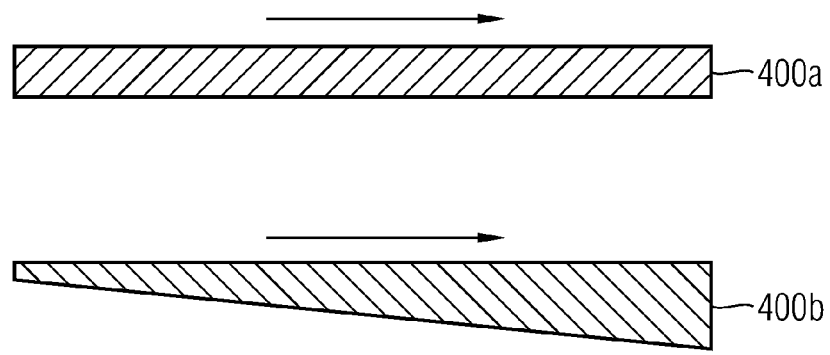
FIG. 4A shows schematic plan views on a connecting line for discussing effects underlying the invention.

FIG. 4A shows the effect of shear stress resulting eventually in mechanical failure. A straight metal line 400a is provided on a rigid base, for example a base including single-crystalline silicon and silicon oxides. The metal line 400a is provided from aluminum Al, copper Cu, an aluminum-based alloy or a copper-based alloy, for example AlCu or AlSiCu. Under thermal stress the different thermal expansion coefficients of silicon and the metallization stack result in shear stress in the metal line 400a. The shear stress induces a transport of material along the direction of the shear force. The transport of material leads to an increase of the cross-sectional area in the direction of the shear force. When the shear stress is effective along the direction in which the metal line extends the increase of the cross-sectional area may be significant if the metal line is long as shown with metal line 400b.

Figure 4B:
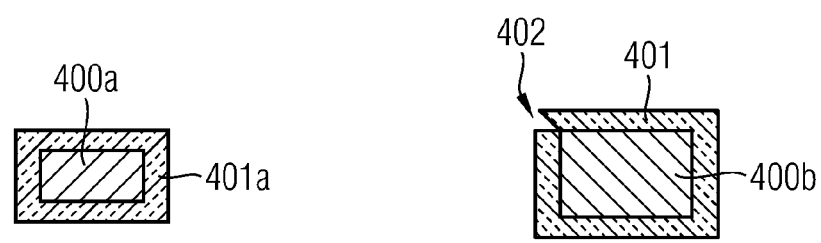
FIG. 4B shows schematic cross-sectional views of a connecting line for discussing effects underlying the invention.

FIG. 4B shows an end portion of the metal line 400a of FIG. 4A without shear stress on the left hand side and under shear stress on the right hand side. Under shear stress, an oxide or nitride sheath 401 of a metal line 400b showing an increased cross-sectional area tends to break such that material may leak from the metal line 400b to outside the oxide or nitride sheath 401.

The embodiments illustrated in FIGS. 5A to 5F refer to a straight portion of a connecting line 800 like the gate line 830, the sense line 812 or the tapping line 813 of FIG. 3 that connects a first element in a cell array, for example a power transistor cell, a sense transistor cell or a sense element, and a second element within or outside the cell array, for example a terminal, a pad, another transistor cell or a sense current evaluation unit. The connecting line 800 is arranged between a metal structure and the cell array. For example, the connecting line 800 is arranged in a layer between the metal structure and a semiconductor body including source, body and drain regions of the transistor cells. According to another embodiment, the connecting line 800 is formed alongside the metal structure, for example in the same metal layer. A dielectric structure separates the metal structure and the connecting line 800.

At least a portion of the connecting line 800 runs between a first and second axis 891, 892, which are arranged in parallel and at a distance to each other which is greater than a minimum width of the connecting line portion 800 in a direction perpendicular to the first and second axes 891, 892. The connecting line portion 800 is tangent to both the first axis 891 and the second axis 892. The first and second axes 891, 892 span a target corridor, in which the connecting line portion 800 runs but which is not completely filled with the connecting line portion 800. The first and second axes 891, 892 may be arranged in a plane parallel to a surface of a semiconductor die in which the cell array is formed or in different planes.

Figure 5A:
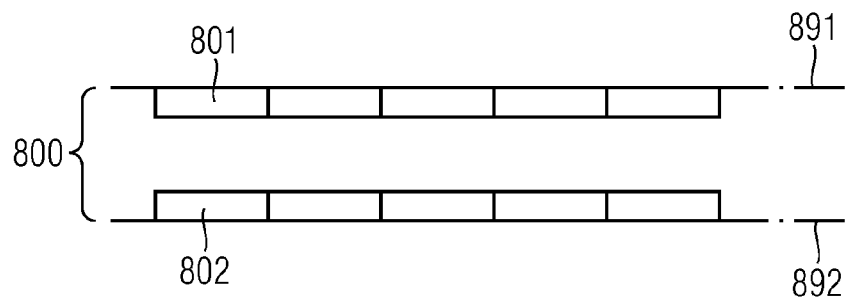
FIG. 5A is a simplified plan view of a connecting line according to an embodiment providing two contiguous parallel portions.

According to the embodiment of FIG. 5A, the connecting line 800 includes first sections 801 that are tangent to the first axis 891 and second sections 802 that are tangent to the second axis 892. The first sections 801 form a first contiguous line and the second sections 802 form a second contiguous line, wherein an insulating structure 809 is arranged between the first and second contiguous lines. The insulating structure 809 spatially separates the first and second contiguous lines forming the connecting line 800. The connecting line 800 includes further portions where the first and second contiguous lines are connected to each other. According to another embodiment, further sections may connect the first and second sections within the cell array such that the connecting line has a ladder-like shape.

In other words, the connecting line 800 is split or divided in two or more straight contiguous lines. Though both portions of the connecting line 800 encounter the same shear stress, they exhibit a lower increase of the cross-sectional area as one would expect when applying a proportional approach. Instead, grain boundaries in the metal more effectively block a material transport at smaller cross-sections such that the grain size of the metal is in the range of the width of the connecting line. Where a grain boundary extends over a large portion of the cross-sectional area, the grains inhibit a transport of material perpendicular to the cross-section. As a consequence, reducing the cross-sectional area of a straight portion of the connecting line 800 can suppress approximately completely any material transport and the cracking of insulating layers covering the connecting line 800 can be avoided. The first sections 801 forming the first contiguous line may have another width than the second sections 802 forming the second contiguous line. According to an embodiment, the first and second sections 801, 802 have the same width. Usually it is not feasible to arbitrarily narrow or split each type of connecting line under or alongside of the metal structure, because connecting lines connected to the metal structure and connecting this metal structure to, for example, the source regions in the cell array need a minimum width in order to allow reliable placement of contact structures to the source regions and vias to the metal structure.

Figure 5B:
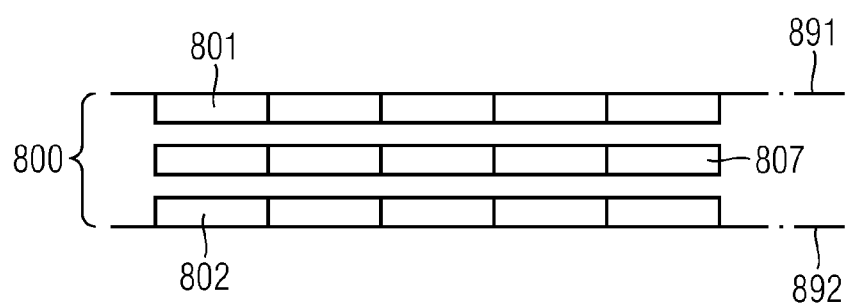
FIG. 5B is a simplified plan view of a connecting line according to an embodiment providing three contiguous parallel portions.

According to another embodiment shown in FIG. 5B further sections 807 may form a further contiguous line running in the corridor defined by the first and second axes 891, 892. Other embodiments may provide more than three contiguous lines.

Figure 5C:
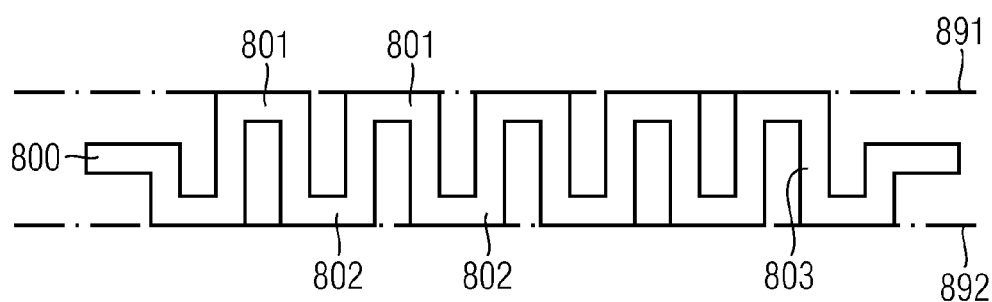
FIG. 5C is a plan view of a connecting line according to an embodiment providing a meandering line in a plane parallel to a surface of semiconductor die.

According to the embodiment of FIG. 5C the first sections 801 are arranged to form a first dashed line and the second sections 802 are arranged to form a second dashed line, wherein the first and second dashed lines are staggered against each other. Third sections 803 of the connecting line 800 extend between the first and the second sections 801, 802, wherein each third section 803 connects a first section 801 and a second section 802 to form a contiguous, meandering connecting line 800. The first, second and third sections 801, 802, 803 are formed in a plane horizontal to a substrate surface of the semiconductor die. The length of the first and second sections 801, 802 may vary along the connecting line 800.

The length of the first and second sections 801, 802 is short compared to the corresponding portion of the connecting line 800. As a consequence, a material transport effected by shear stress is significantly reduced. The probability that an insulator sheath covering the connecting line 800 breaks is significantly reduced and the reliability of the integrated circuit is significantly increased, because shear stress is only effective on short sections of the connecting line 800 and only few material can be transported under shear stress. The increase of the cross-sectional area is limited.

Figure 5D:
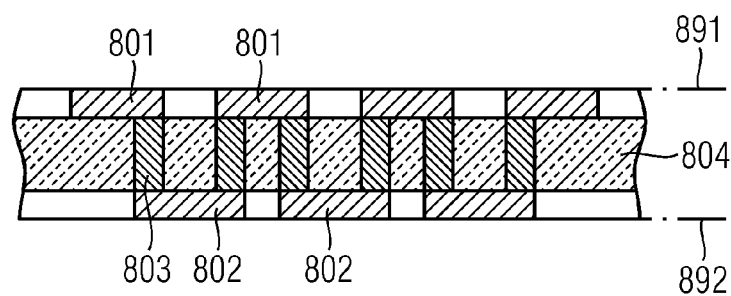
FIG. 5D is a cross-sectional view of a semiconductor die including a connecting line according to an embodiment providing a meandering line in different planes.

According to the embodiment shown in FIG. 5D a contiguous meandering connecting line 802 is realized in two different planes of a semiconductor die. For example, the first sections 801 are formed in a first wiring layer and the second sections 802 are formed in a second wiring layer. The second and third portions 802, 803 may be formed from a metal, a conductive metal oxide, a conductive metal nitride, a metal alloy or from doped polysilicon or any other electrically conducting material. The third sections 803 may extend through a dielectric layer 804 separating the first wiring layer and the second wiring layer.

Figure 5E:
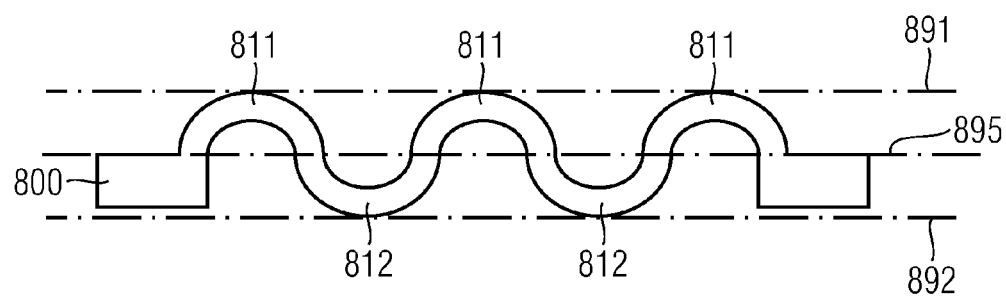
FIG. 5E is a schematic plan view of a meandering connecting line in accordance with an embodiment providing bowed portions.

FIG. 5E refers to an embodiment where the connecting line 800 comprises first segments 811 tangent to the first axis 891 and a center line 895 and second segments 812 tangent to the second axis 892 and the center line 895. The center line 895 runs parallel to and in the middle of the first and the second axis 891, 892. The first segments 811 are arranged in a direction defined by the first and second axes 891, 892 in a staggered manner. Accordingly, the second segments 812 are arranged along the same direction and also in a staggered manner in a way that the first and second segments 811, 812 form a contiguous, meandering line. The first and second segments 811, 812 may be bowed with the apexes tangent to the first and second axes 891, 892.

Figure 5F:
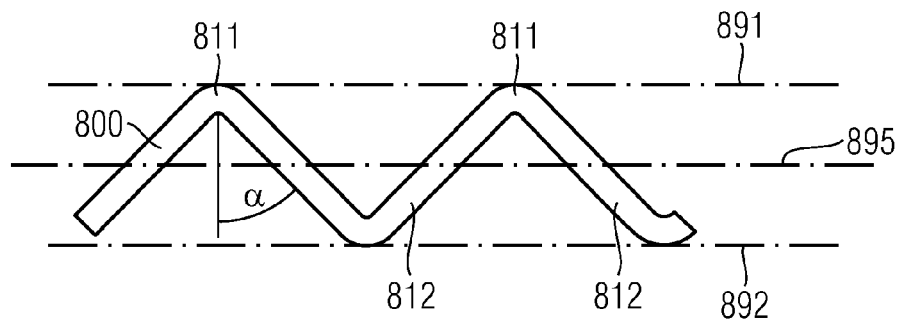
FIG. 5F is a schematic plan view of a meandering connecting line in accordance with an embodiment providing slant portions.

According to the embodiment shown in FIG. 5F, each first and second segment 811, 812 comprises two straight subsections respectively, wherein the two sub-sections are connected to each other at a predefined angle less than 180 degrees to form an apex. The apexes of the first segments 811 are tangent to the first axis 891 and the apexes of the second segments 812 are tangent to the second axis 892.

As regards the embodiments of FIGS. 5D and 5E, the first and second segments 811, 812 may have different shapes. According to an embodiment, the first and second segments 811, 812 have the same shape and are arranged axis-symmetric as regards the center line and staggered against each other along the center line. The length of the first and second segments 811, 812 may vary along the connecting line 800.

As regards the embodiments shown in FIGS. 5A to 5F, the first and second sections 801, 802 and the first and second segments 811, 812 may have different widths. According to an embodiment, the first and second sections 801, 802 have the same width and according to other embodiments the first and second segments 811, 812 have the same width such that segmentation effects and grain size effects are maximized. A considerable reduction of shear-induced material transport is typically observable for cross-sectional areas up to 5 times of the mean grain cross-sectional area.

Typically, for aluminum-based alloys the grain boundaries inhibit material transport at widths below 2 micrometer, for example at widths of 1.5 micrometer or less at a height of the connecting line of 300 to 500 nanometers.

According to an embodiment, the connecting line 800 is made of a material selected from a group containing aluminum Al, aluminum-based alloys, copper Cu, or copper-based alloys, for example AlCu or AlSiCu. The first and second sections 801, 802 and the first and second segments 811, 812 may have a width not greater than 2 micrometer, for example about 1.5 micrometer. The first and second sections 801, 802 and the first and second segments 811, 812 may have a height not greater than 1 micrometer, for example about 500 nanometers. The connecting line 800 may further include one or more liners containing tantalum Ta, titanium Ti, a tantalum compound, a titanium compound or tungsten, by way of example. The connecting line 800 is covered by an insulating material, for example a silicon oxide, silicon nitride or another dielectric material, for example a dielectric polymer or a glass. The pertinent portion of the connecting line 800 does not adjoin to contact vias to a metal structure arranged above the connecting line 800. Since the connecting line 800 does not transport high currents, electromigration effects are of no relevance.

FIG. 6A shows a cross-sectional view through a cell array of a semiconductor die 990 perpendicular to the direction along which gate trenches and transistor cells extend. The semiconductor die 990 includes a semiconductor substrate 190 which may be a single-crystalline semiconductor, for example single-crystalline silicon. Directly adjacent to a first surface 101 of the semiconductor substrate 190 source regions 110 of a first conductivity type are formed. Adjacent to a second surface which is opposed to the first surface 101, a drain region 180 of the first conductivity type is formed. A drift zone 120 of the same conductivity type may be formed adjacent to the drain region 180, wherein a dopant concentration in the drift zone is lower than a dopant concentration in the drain region 180. Formed between the source regions 110 and the drift zones 120 are body regions 115 of a second conductivity type which is the opposite of the first conductivity type. According to an embodiment the first conductivity type is the n-type and the second conductivity type is the p-type.

Gate trenches extend from the first surface 101 into the semiconductor substrate 190. The gate trenches extend in a direction perpendicular to the cross-sectional plane. Within the cell array the gate trenches form regularly-spaced parallel stripe-shaped grooves. In the gate trenches a gate conductor structure 112 may be formed at a depth corresponding to the body region 115. A gate dielectric separates the gate conductor structure and the semiconductor substrate 190. The gate trenches may further include field electrodes or further conductive portions electrically insulated from the gate conductor structure 112. A dielectric structure 116 including the gate dielectric separates the gate electrode and further conductive structures within the gate trenches against each other and the semiconductor substrate 190. A potential applied at the gate electrode 112 controls the minority charge carrier distribution in the body region 115. In an off-state of the transistor cells, the body regions 115 inhibit a current flow between the source regions 110 and the drain region 180. In the on-state an electric field generated by a potential of the gate conductor structure 112 may result in an accumulation of charge carriers in portions of the body regions 115 along the gate dielectric allowing a current to flow between the source regions 110 and the drain region 180.

A first dielectric layer 200 may be provided on the first surface 101. The first dielectric layer 200 may be a silicon oxide, silicon nitride, silicon oxynitride BPSG (boron phosphate silicate glass) or any other doped silicon oxide. A first metallization plane includes source lines 805 and a connecting line 800 serving as a sense line. Contact structures 299 connect the connecting line 800 with body and source regions 115, 110 of a sensor transistor cell 982 and source lines 805 with the body and source regions 115, 110 of power transistor cells 981 on both sides of the sense transistor cell 982. The source lines 805 run parallel to each other and may have a width that approximates or is greater than the width of a corridor in which the connection line 800 runs. A second dielectric layer 851 provides insulating structures spatially separating and electrically insulating neighboring source lines 805 and the connecting line 800 from each other.

The second dielectric layer 851 may consist of one layer or may include two or more sub-layers. According to an embodiment the second dielectric layer 851 comprises a first sub-layer made of silicon oxide, silicon nitride or BPSG and a second sub-layer that may comprise a diffusion barrier layer inhibiting a diffusion of metal atoms in the first sub-layer 851. A metal structure forming a source electrode 910 is provided on the second dielectric layer 851. Contact vias 855 extend through openings of the second dielectric layer 851 and electrically connect the source electrode 910 with the source lines 805. On the second surface a drain electrode 920 may be provided in direct contact with the drain region 180. The source and drain electrodes 910, 920 may consist of or include aluminum Al, copper Cu, an aluminum-based alloys or a copper-based alloy with or without further liners, respectively.

The sense line 800 may be provided according to one of the embodiments of FIGS. 5A to 5F, for example with first and second sections 801, 802 forming contiguous lines such that they can extend from a cell array, which may be formed in the certain area of the semiconductor die 990 to a structure outside the cell array. Due to the configuration of the sense line 800, a significant material transport does not occur along the direction in which the sense line 800 extends. The first and the second dielectric layers 200, 851 are not exposed to stress resulting from a material transport along the sense line 800 and no material leaks out from the sense line 800. In total, for widths below 2 μm, the lifetime of the integrated circuit can be greatly improved by a factor of 10 or more. Typically, the sense line 800 is formed as similar as possible to the source lines 805 in order to let the sense current follow the load current as closely as possible. The sense lines 800 according to the embodiments described herein do not adversely affect a load current measure for the transistor cells.

Figure 6B:
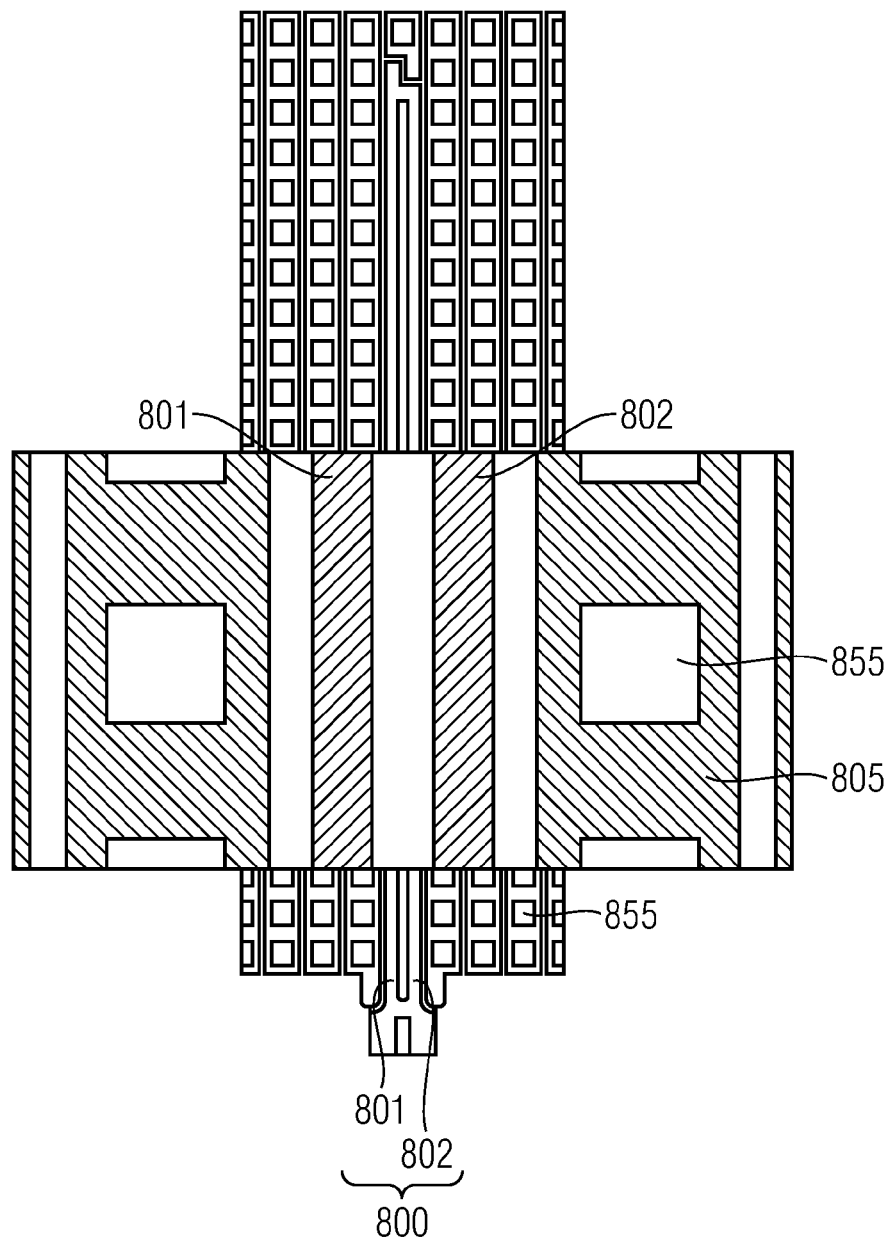
FIG. 6B is a schematic plan view of the portion of the integrated circuit of FIG. 6A.

FIG. 6B shows a layout of the cell array of FIG. 6A. Contact vias 855 connect the source lines 805 with the source electrode 910 of FIG. 6A, which is not shown in FIG. 6B. First sections 801 of the sense line 800 form a first contiguous line and second sections 802 form a second contiguous line. Both lines extend between a first axis and a second axis, wherein the width of the first and second contiguous lines is about 1.5 μm and a distance between the first and the second axis is about 4.5 μm and may be smaller than a width of the source lines 805, which may have a width of about 5.4 μm. At or near the origin of the sense line 800 in the cell array and outside the cell array the two contiguous lines may be connected to each other. Source lines 805 having a width of about 5.4 μm extend parallel to the sense line 800. In the case of the source lines 805, the contact vias 855 may limit a shear stress along the direction in which the source lines extend.

Figure 7A:
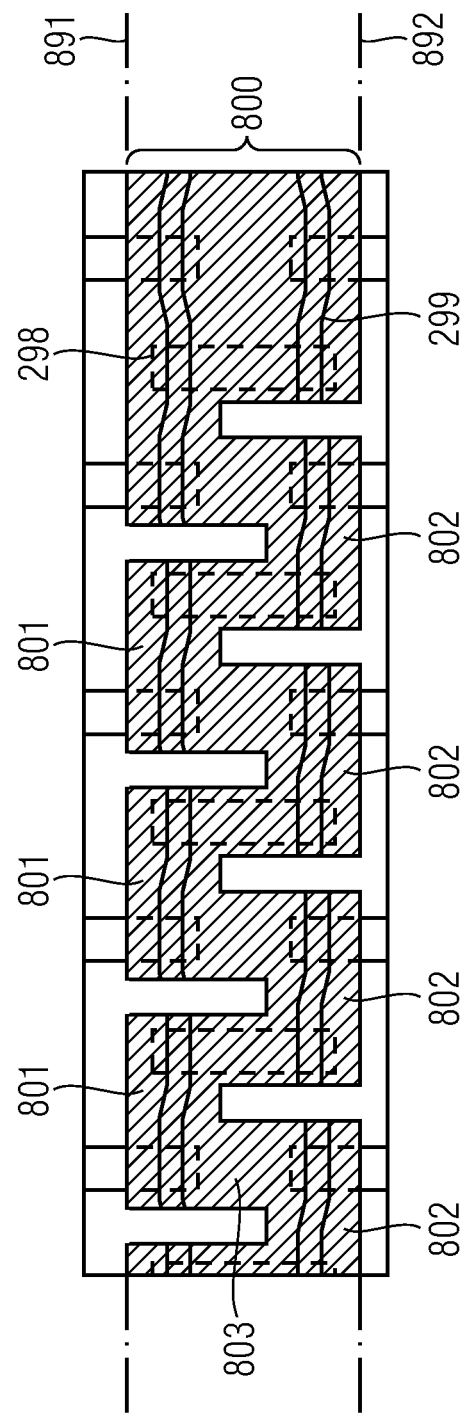
FIG. 7A shows a schematic layout of a portion of an integrated circuit including a meandering sense line in accordance with a further embodiment.

FIG. 7A shows a sense line 800 formed as a contiguous meandering line, wherein the meanders are formed from first sections 801 arranged tangent to a first axis 891 and along the first axis, second sections 802 arranged tangent to a second axis 892 and along the second axis and third sections 803 connecting the first and second sections 801, 802 at right angles, respectively. Highly doped body contact regions 298 are embedded in the source regions. The body contact regions 298 are arranged in a staggered manner. Contact structures 299 contact the body contact regions 298 and source regions between two neighboring gate trenches, respectively. The contact structures 299 are line-shaped and are provided below the first and second sections 801, 802. The meandering sense line 800 is formed above contact structures 299 assigned to the source regions on opposing sides of the gate trench of the sense transistor cell.

FIG. 7B refers to an embodiment based on the same cell layout as FIG. 7A. Contiguous lines formed by first sections 801 and second sections 802 form a sense line 800 that is arranged above contiguous contact structures 299 to the source regions and to body contact regions 298, wherein the contact structures 299 are in direct contact with two source regions on opposing sides of a gate trench. Each section 801, 802 contacts one of the contiguous contact structures 299.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   power transistor cells formed in a cell array;
   a metal structure formed above the cell array; and
   a connecting line electrically connecting a first element arranged in the cell array and a second element arranged outside the cell array, a portion of the connecting line arranged between the metal structure and the cell array, the portion running between a first axis and a second axis arranged in parallel and at a distance to each other, wherein the distance is greater than a width of the connecting line portion and the connecting line portion is tangent to both the first axis and the second axis.

2. The integrated circuit according to claim 1, further comprising an insulating structure arranged between the connecting line and the metal structure and electrically insulating the connecting line from the metal structure.

3. The integrated circuit according to claim 1, wherein the connecting line comprises at least one conductive liner from a material selected from a group consisting of titanium, tantalum, tungsten, a titanium compound, a tantalum compound and a tungsten compound.

4. The integrated circuit according to claim 1, wherein no contact vias are formed connecting the connecting line and the metal structure.

5. The integrated circuit according to claim 1, wherein the first element is one of the power transistor cells and the connecting line is arranged to electrically connect a gate conductor structure of the power transistor cell and the second element.

6. The integrated circuit according to claim 1, wherein the first element is one of the power transistor cells and the connecting line is arranged to electrically connect a source region of the power transistor cell and the second element.

7. The integrated circuit according to claim 1, wherein the first element is a sense element and the connecting line is arranged to electrically connect a signal output of the sense element and the second element.

8. The integrated circuit according to claim 1, wherein the first element is a sense transistor cell with a current-sense path between a drain terminal and the second element.

9. The integrated circuit according to claim 1, wherein the connecting line includes first sections that are tangent to the first axis and second sections that are tangent to the second axis.

10. The integrated circuit according to claim 9, wherein the first and second sections have a same width.

11. The integrated circuit according to claim 9, wherein the first and second sections have a width not greater than a mean grain size of the connecting line.

12. The integrated circuit according to claim 9, wherein the first and second sections have a width not greater than 2 micrometer.

13. The integrated circuit according to claim 9, wherein the connecting line is made of a material selected from a group consisting of aluminum, aluminum-based alloys, copper and copper-based alloys.

14. The integrated circuit according to claim 9, wherein the first sections are arranged to form a first contiguous line and the second sections are arranged to form a second contiguous line, and an insulating structure is arranged between the first and second contiguous lines, the insulating structure spatially separating the first and second contiguous lines.

15. The integrated circuit according to claim 9, wherein the first sections are arranged to form a first dashed line and the second sections are arranged to form a second dashed line, the first and second dashed lines are staggered against each other, and the connecting line further comprises third sections, each third section connecting a first section and a second section to form a contiguous meandering line.

16. The integrated circuit according to claim 15, wherein the first, second and third sections are formed in one plane.

17. The integrated circuit according to claim 15, wherein the first and second sections are formed in different planes, and the third sections are contact vias extending in a direction vertical to the planes.

18. The integrated circuit according to claim 1, wherein the connecting line includes first segments tangent to the first axis and a center line and second segments tangent to the second axis and the center line, the center line running parallel to and in the middle of the first and second axes, wherein the first segments are arranged along the first axis in a staggered manner and the second segments are arranged along the second axis in a staggered manner, and wherein the first and second segments are arranged to form a contiguous meandering line.

19. The integrated circuit according to claim 18, wherein the first and second segments have the same shape.

20. The integrated circuit according to claim 19, wherein the first and second segments are arranged axis-symmetric with regard to the center line and staggered against each other along the center line.

21. The integrated circuit according to claim 18, wherein the first and second segments are bowed, and apexes of the first segments are tangent to the first parallel axis and apexes of the second segments are tangent to the second parallel axis.

22. The integrated circuit according to claim 18, wherein each first and second segment comprises two straight sub-sections, the two sub-sections connected to each other at a predefined angle less than 180 degree to form an apex, and wherein apexes of the first segments are tangent to the first axis and apexes of the second segments are tangent to the second axis.

23. The integrated circuit according to claim 13, wherein the second element is a contact pad or a sense current evaluation unit.

24. The integrated circuit according to claim 1, wherein the connecting line is arranged in a layer between the metal structure and a semiconductor body comprising the source and drain regions of the power transistor cells.

25. An integrated circuit comprising:

power transistor cells formed in a cell array;

a metal structure formed above the cell array; and a connecting line electrically connecting a first element arranged in the cell array and a second element arranged in the cell array, the connecting line arranged between the metal structure and the cell array and running between a first axis and a second axis arranged in parallel and at a distance to each other, wherein the distance is greater than a width of the connecting line and the connecting line is tangent to both the first axis and the second axis.

* * * * *